United States Patent [19]

Berkstresser et al.

[11] 4,400,445
[45] Aug. 23, 1983

[54] LIQUID PHASE EPITAXIAL GROWTH OF GARNET FILMS

[75] Inventors: George W. Berkstresser, Bridgewater; Stuart L. Blank, Madison, both of N.J.

[73] Assignee: Bell Telephone Laboratories, Incorporated, Murray Hill, N.J.

[21] Appl. No.: 322,677

[22] Filed: Nov. 18, 1981

Related U.S. Application Data

[63] Continuation of Ser. No. 163,958, Jun. 30, 1980, abandoned.

[51] Int. Cl.$^3$ .............................................. C30B 19/02
[52] U.S. Cl. .................................... 428/700; 252/364; 156/624; 156/DIG. 63
[58] Field of Search ................. 156/617 SP, 622, 624, 156/DIG. 63, DIG. 106; 148/171, 172; 252/364; 427/86, 431; 428/700

[56] References Cited

U.S. PATENT DOCUMENTS 3,790,405  2/1974  Levinstein .......................... 156/622
4,165,410  8/1979  Blank ................................. 252/364

OTHER PUBLICATIONS

Wanklyn et al., "Solubility and Relative Supersaturation", published in J. of Cryst. Growth, vol. 49, pp. 182–188, Sep. 1979.

Blank et al., "Kinetics of LPE Growth", published in A.I.P. Conf. Proc., pp. 256–270, Oct. 1974.

Randles, "LPE Growth of Magnetic Garnets", in book Crystals by Springer-Verlag Press, N.Y., pp. 71–91, Nov. 1978.

Feigelson, "Flux Growth", published in J. of the Amer. Cerm. Soc., vol. 51, pp. 538–539, Sep. 1968.

*Primary Examiner*—Hiram H. Bernstein
*Attorney, Agent, or Firm*—Peter A. Businger

[57] ABSTRACT

The manufacture of magnetic bubble devices typically involves a step of epitaxially depositing a layer of a garnet material on a substrate having suitable lattice parameters, e.g., layers of certain rare earth-iron garnets are conveniently deposited on a gallium-gadolinium garnet substrate. Deposition by liquid epitaxy has been preferred and, in particular, deposition from a melt comprising garnet materials in a $PbO-B_2O_3$ flux.

According to the invention, garnet layers are epitaxially grown from a melt comprising a $PbO-V_2O_5$ flux. Growth from such melt has desirably slow kinetics, resulting in slow deposition as is beneficial especially for the growth of layers on an assembly of substrates. Additional benefits are ease of removal of liquid droplets remaining on a grown film upon removal from the melt, both by spinning and by rinsing.

6 Claims, 3 Drawing Figures

LIQUID PHASE EPITAXIAL GROWTH OF GARNET FILMS

This is a continuation of application Ser. No. 163,958 filed June 30, 1980, abandoned.

FIELD OF THE INVENTION

The invention is concerned with liquid phase epitaxial growth of garnet films as may be used in the manufacture of magnetic bubble devices.

BACKGROUND OF THE INVENTION

The development of magnetic bubble devices has reached the stage of commercial use, particularly for the storage of sequentially retrievable data in communications and data processing equipment.

Magnetic bubble devices typically comprise a flat, nonmagnetic substrate of a material such as, e.g., gadolinium-gallium garnet, nominally $Gd_3Ga_5O_{12}$, and a layer of a magnetic garnet material which is epitaxially deposited on the substrate and whose easy direction of magnetization is perpendicular to the layer. In the presence of a suitable magnetic bias field parallel to such direction, the layer is capable of sustaining small domains, called bubbles, which are magnetized in a direction opposite to the direction of the bias field. Desirable domains typically have right circular cylindrical shape and extend from near the surface of the magnetic film to the vicinity of the film-substrate interface. Bubble diameter may be approximately equal to the thickness of the film.

Device operation typically involves the nucleation, propagation, and detection of magnetic bubbles, propagation being along paths or tracks which may be defined, e.g., by magnetic overlays, by a pattern of locally modified magnetic properties in the layer, or by a conductor overlay as disclosed in the paper by A. H. Bobeck et al., "Current-Access Magnetic Bubble Circuits", *Bell System Technical Journal*, Vol. 58, No. 6, July-August 1979, pp. 1453–1540.

Preferred for the deposition of magnetic garnet layers on a substrate is a method of liquid phase epitaxy, involving controlled growth from garnet constituents in flux solution as disclosed in U.S. Pat. No. 3,790,405, issued Feb. 5, 1974 to H. J. Levinstein. Properties of resulting layers such as, e.g., thickness, defect density, magnetization. coercivity, anisotropy field, and bubble diameter, stability, and mobility are dependent on growth conditions such as, e.g., melt composition, growth temperature, and growth procedure as discussed in papers by S. L. Blank et al., "Kinetics of LPE Growth and its Influence on Magnetic Properties", *AIP Conference Proceedings*, Vol. 10 (1974), pp. 255–270; S. L. Blank et al., "Preparation and Properties of Magnetic Garnet Films Containing Divalent and Tetravalent Ions", *Journal of the Electrochemical Society*, Vol. 123, No. 6, June 1976, pp. 856–863; and S. L. Blank et al., "The effect of Melt Composition on the Curie Temperature and Flux Spin-Off from Lutetium Containing LPE Garnet Films", *IEEE Transactions on Magnetics*, Vol. MAG-13, No. 5, September 1977, pp. 1095–1097.

As disclosed in papers cited above, a $PBO-B_2O_3$ flux has been preferred for garnet growth, such preference being due, at least in part, to nonwetting of a growing garnet layer by the flux. As disclosed in U.S. Pat. No. 4,165,410, issued Aug. 21, 1979 to S. L. Blank, wetting fluxes such as, e.g., a boron oxide-bismuth oxide flux are not precluded.

As magnetic device technology progresses towards increasingly higher bit densities, layer specifications change; in particular, specified layer thickness decreases as shown, e.g., in the paper by S. L. Blank et al., "Design and Development of Single Layer, Ion-Implantable Small Bubble Materials for Magnetic Bubble Devices", *Journal of Applied Physics* 50, March 1979, pp. 2155–2160.

Relevant with respect to the invention is a phase diagram of the $PbO-V_2O_5$ system as shown by E. M. Levin et al., "Phase Diagrams for Ceramists", *American Ceramic Society*, p. 117.

SUMMARY OF THE INVENTION

Magnetic bubble devices comprising a garnet layer or film are manufactured by a method which comprises epitaxial growth of such layer on a substrate. Growth is in a melt comprising flux and garnet constituents; according to the invention, the flux preferably comprises $PbO$ and $V_2O_5$. Molecular percent $PbO$ is in a preferred range of 67–99, at least half of the remainder being $V_2O_5$. Use of such flux results in desirably slow film growth kinetics. Additional benefits derived from liquid phase epitaxy growth according to the invention are ease of removal of liquid droplets remaining on a grown film upon removal from the melt, both by spinning and by rinsing.

DETAILED DESCRIPTION

According to the invention it has been discovered that, in the interest of desirably slow growth of epitaxial garnet layers in liquid phase epitaxy, use of a $PbO-V_2O_5$ flux is advantageous. Preferred flux composition comprises $PbO$ in the range of 67–99 molecular percent and, in the interest of conveniently low melting temperature, preferably in the range of 85–95 molecular percent. Complementary portion of the flux may consist entirely of $V_2O_5$ or may comprise other flux components such as, e.g., $B_2O_3$, provided that a preferred amount of at least 50 molecular percent of such complementary portion is $V_2O_5$.

Garnets suitable for magnetic device application are typically patterned after the prototype, yttrium-iron garnet, $Y_3Fe_5O_{12}$ which, in its unaltered form, is ferrimagnetic with net magnetic moment of approximately 1750 gauss at room temperature. More generally, garnets may comprise rare earth ions other than yttrium as may be expressed by the formula $R_3Fe_5O_{12}$, where R denotes a rare earth element of the lanthanide series (atomic numbers 57 to 71) or a combination of two or more such elements.

Magnetic moment may be modified by partial substitution of Fe ions, e.g., by Ga ions, resulting in a material having nominal composition according to the formula $R_3Fe_{5-x}Ga_xO_{12}$, where x denotes a positive number less than 5 and preferably less than 2. Iron substitution may also be by replacement of Fe ions with Ge ions, in which case there is a need for valence balancing, e.g., by replacement of a portion of rare earth ions by suitable divalent or monovalent ions. For example, replacement of rare earth ions by the divalent ion Ca results in compositions which may be formulated as $R_{3-y}Ca_y$-$Fe_{5-x}Ge_xO_{12}$, where x and y are approximately equal.

While magnetic bubble devices are typically based on the use of rare earth-iron magnetic garnet materials, layers of other garnets such as, e.g., gadolinium-gallium garnet and gadolinium-aluminum garnet may also be produced according to the invention. What is required in each instance is a substrate whose lattice parameters at least approximately match those of the layer to be grown. Resulting grown layers may exhibit magnetic anisotropy as may be growth or strain induced. Easy direction of magnetization may be perpendicular to a substrate as, e.g., in bubble layers. Layers having easy direction parallel to the substrate may be deposited for hard bubble suppression.

Figure 1:
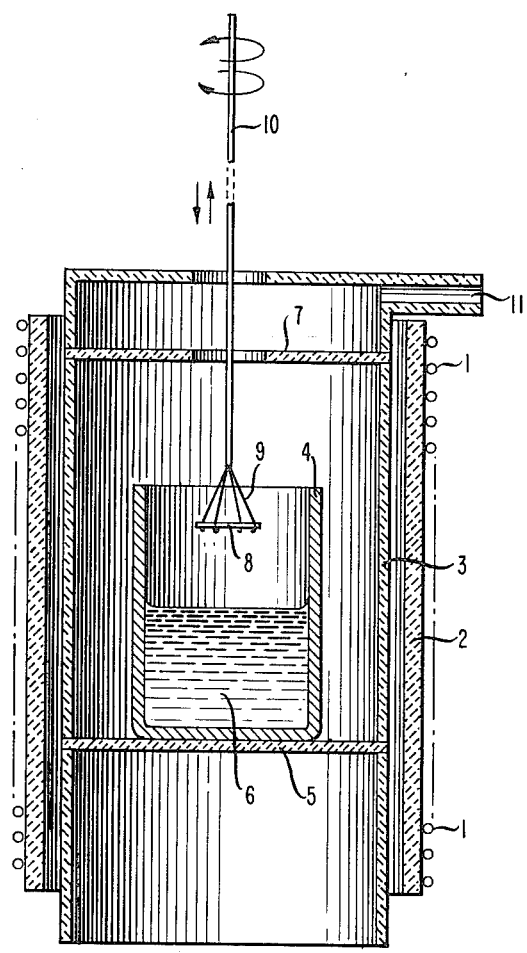
FIG. 1 is a schematic view of apparatus as may be used for liquid phase epitaxy growth of magnetic garnet films according to the invention.

Apparatus suitable for magnetic garnet epitaxial deposition according to the invention is schematically depicted in FIG. 1. In particular, FIG. 1 shows heating element 1 on ceramic support tube 2 surrounding ceramic liner tube 3. Crucible 4 is supported by baffle 5 and contains melt 6 comprising garnet and flux materials. Baffle 7 acts as a radiation shield for preventing excessive cooling of the surface of melt 6. Substrate 8 is attached to substrate holder 9 which is attached to rod 10.

Operation of apparatus involves heating the melt, first at elevated temperature for homogenization and equilibration, and then at a temperature corresponding to supercooling of garnet material (preferably at a temperature which is at least 3 degrees less than the saturation temperature of garnet material in flux material), lowering rod 10 until substrate 8 is immersed in or at least in contact with the surface of melt 6, and, typically, rotating rod 10. An exhaust pump may be connected at 11.

Figure 2:
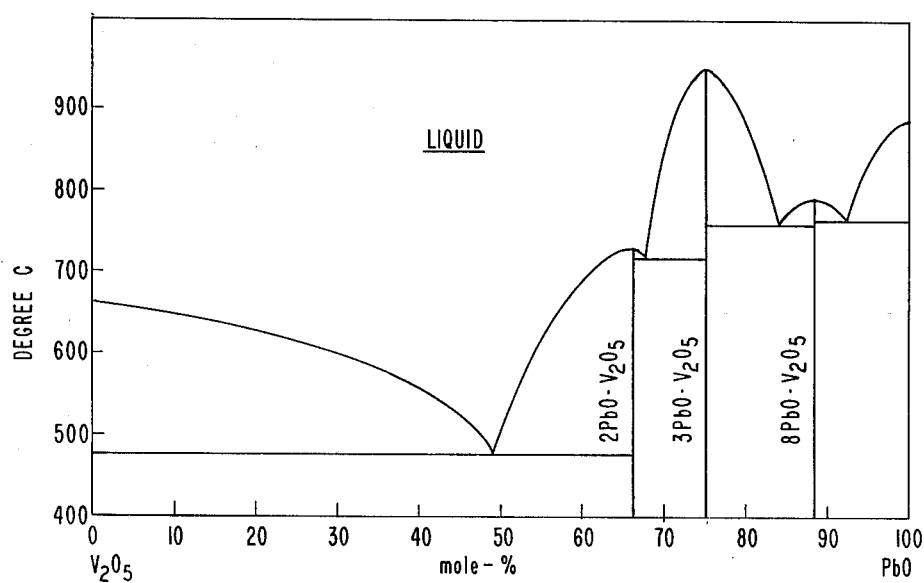
FIG. 2 is a phase diagram of the $PbO-V_2O_5$ system according to E. M. Levin et al., cited above.

FIG. 2 is a phase diagram of the binary system $PbO-V_2O_5$. According to the diagram, compositions comprising PbO in an approximate preferred range of 67–99 molecular percent are in the liquid state at temperatures at which liquid phase epitaxy is preferably carried out. In the interest of minimizing inclusion of lead, melt temperature is preferably above a temperature of approximately 820 degrees C.

Among advantages of epitaxial garnet growth according to the invention are desirably slow kinetics and, in particular, relatively slow growth per degree supercooling. Such slow kinetics are particularly advantageous for the growth of thin layers whose thickness may be specified not to exceed 10, 5, or even 2 micrometers. Furthermore, slow growth is advantageous where films are epitaxially grown on an assembly of substrates and, in particular, where immersing such assembly in a melt and removal from the melt take an appreciable amount of time relative to growth time. In such cases growth rates of less than 0.5 micrometer per minute may be desirable when films are grown having a nominal thickness not exceeding a few micrometers.

Figure 3:
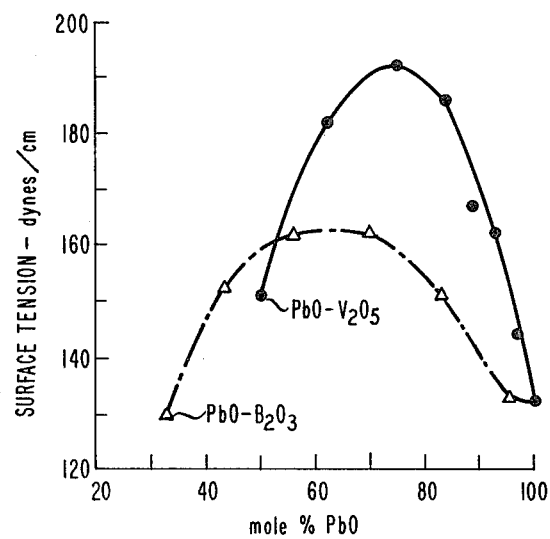
FIG. 3 is a diagram of surface tension versus percent $PbO$ for binary flux systems $PbO-V_2O_5$ according to the invention as compared with a prior art flux system $PbO-B_2O_3$. Surface tension was measured by the maximum bubble pressure technique using a 0.08 cm inner diameter Pt capillary tube and flowing oxygen gas. Melt temperature was approximately 950 degrees C.

While desirably slow kinetics of liquid phase epitaxy growth is a primary feature of the invention, additional benefits of use of a $PbO-V_2O_5$ flux according to the invention are derived from greater stability of the supercooled liquid which yields reduced occurrence of spontaneous nucleation of garnet particles within the liquid, and the observed ease with which melt droplets are removed from a grown layer upon removal from the melt. Ease of removal by spinning may be due to greater surface tension of the new flux as contrasted in FIG. 3 with a prior art flux. Also observed was ease of rinsing in dilute nitric acid.

Magnetic bubble devices are made, using layers produced according to the invention, by providing means for nucleating, propagating, and detecting magnetic bubbles in a magnetic layer. Such means may take a variety of forms as reviewed, e.g., in the paper by A. H. Bobeck et al. cited above.

As illustrated by the following examples, garnet films were deposited by liquid phase epitaxy on circular $Gd_3Ga_5O_{12}$ substrates having a diameter of 5 cm. Cleaning of substrates before layer growth was as follows: 20 minutes in an ultrasonic bath of 1 gm Alconox in 100 milliliter water at 50 degrees C., rinsing in warm water, 15 minutes in an ultrasonic bath of water at 50 degrees C., and rinsing in three-stage overflow deionized water for 5 minutes per stage. After growth, cleaning was as follows: 10 minutes in a solution of 6 volumes $H_2O$, 3 volumes $HNO_3$, and 1 volume $CH_3COOH$ at 75 degrees C., rinsing in warm water, and repeating steps of pregrowth cleaning.

Substrates were rotated at 75 revolutions per minute in an oscillating mode during epitaxial deposition.

EXAMPLE 1. (PRIOR ART)

A layer of yttrium-iron garnet was epitaxially deposited on a gadolinium-gallium garnet substrate in a melt comprising flux components $B_2O_3$ and PbO in a molecular ratio of 1:15.6. Garnet constituent oxides $Y_2O_3$ and $Fe_2O_3$ were in a ratio of 1:15, and garnet constituents represented 7 molecular percent of the melt. Saturation temperature of this system is approximately 850 degrees C. Growth at a temperature of approximately 840 degrees C. was at a rate of 0.15 micrometer per minute.

EXAMPLE 2. (NEW)

A layer of yttrium-iron garnet was epitaxially deposited according to the invention on a gadolinium-gallium garnet substrate in a melt comprising flux components $V_2O_5$ and PbO in a molecular ratio of 1:9. Garnet constituent oxides $Y_2O_3$ and $Fe_2O_3$ were in the ratio of 1:15, and garnet constituents represented 4 molecular percent of the melt. Saturation temperature of this system is approximately 895 degrees C. Growth at a temperature of approximately 885 degrees C. was at a rate of 0.08 micrometer per minute.

EXAMPLE 3. (PRIOR ART)

A layer of (YLuSmCa) (FeGe) garnet was epitaxially deposited on a gadolinium-gallium garnet substrate in a melt comprising flux components $B_2O_3$ and PbO in a molecular ratio of 1:15.6. Garnet constituent oxides represented 16 molecular percent of the melt. Relative to the combined amount of $Y_2O_3$, $Lu_2O_3$, $Sm_2O_3$, and CaO, there were 11 molecular percent $Lu_2O_3$, 5.9 molecular percent $Sm_2O_3$, and 70 molecular percent CaO. $GeO_2$ molecular percent was 28 relative to the combined amount of $Fe_2O_3$ and $GeO_2$. Ratio of combined rare earth oxides to $Fe_2O_3$ and $GeO_2$ in combination was 1:8.3. Saturation temperature of this system is approximately 930 degrees C. Growth at a temperature of approximately 907 degrees C. was at a rate of 1 micrometer per minute.

EXAMPLE 4. (NEW)

A layer of (YLuSmCa) (FeGe) garnet was epitaxially deposited on a gadolinium-gallium garnet substrate in a melt comprising flux components $V_2O_5$ and PbO in a molecular ratio of 1:9. Garnet constituent oxides represented 6.2 molecular percent of the melt. Relative to the combined amount of $Y_2O_3$, $Lu_2O_3$, $Sm_2O_3$, and CaO, there were 10 molecular percent $Lu_2O_3$, 5.6 molecular percent $Sm_2O_3$, and 71 molecular percent CaO. $GeO_2$ molecular percent was 44 relative to the combined amount of $Fe_2O_3$ and $GeO_2$. Ratio of combined rare earth oxides to $Fe_2O_3$ and $GeO_2$ in combination was 1:8.3. Saturation temperature of this system is approximately 846 degrees C. Growth at a temperature of approximately 834 degrees C. was at a rate of 0.1 micrometer per minute.

EXAMPLE 5. (PRIOR ART)

A layer of (LuLaSm) (FeGa) garnet was epitaxially deposited on a gadolinium-gallium garnet substrate in a melt comprising flux components $B_2O_3$ and PbO in a molecular ratio of 1:15.6. Garnet constituent oxides represented 10 molecular percent of the melt. Relative to the combined amount of $Lu_2O_3$, $La_2O_3$, and $Sm_2O_3$, there were 43 mole percent $La_2O_3$ and 6 mole percent $Sm_2O_3$. $Ga_2O_3$ molecular percent was 11 relative to $Fe_2O_3$ and $Ga_2O_3$ in combination. Ratio of combined rare earth oxides to $Fe_2O_3$ and $Ga_2O_3$ in combination was 1:13.5. Saturation temperature of this system is approximately 905 degrees C. Growth at a temperature of approximately 880 degrees C. was at a rate of 0.8 micrometer per minute.

EXAMPLE 6. (NEW)

A layer of (LuLaSm) (FeGa) garnet was epitaxially deposited on a gadolinium-gallium garnet substrate in a melt comprising flux components $V_2O_5$ and PbO in a molecular ratio of 1:9. Garnet constituent oxides represented 7.3 molecular percent of the melt. Relative to the combined amount of $Lu_2O_3$, $La_2O_3$, and $Sm_2O_3$, there were 55 mole percent $La_2O_3$ and 8.5 mole percent $Sm_2O_3$. $Ga_2O_3$ molecular percent was 8.3 relative to $Fe_2O_3$ and $Ga_2O_3$ in combination. Ratio of combined rare earth oxides to $Fe_2O_3$ and $Ga_2O_3$ in combination was 1:20. Saturation temperature of this system is approximately 905 degrees C. Growth at a temperature of 870 degrees C. was at a rate of 0.2 micrometer per minute.

We claim:

1. Method for making a magnetic bubble device comprising a layer of a garnet material which is epitaxially deposited on a surface of a supporting substrate, said method comprising
   (1) heating a preferred melt consisting essentially of said garnet material and a flux material at a temperature corresponding to supercooling of said garnet material, said flux material comprising PbO and $V_2O_5$, PbO being comprised in said flux material in an amount in the range of 67–99 molecular percent, and $V_2O_5$ being comprised in said flux material in an amount of at least 50 molecular percent of the molecular percent complementary to the molecular percent PbO,
   (2) bringing at least said surface of said substrate in contact with said melt, and
   (3) removing said substrate from contact with said melt upon deposition of said layer on said surface, whereby said deposition is at a desired rate per degree C. of supercooling, said desired rate being less than or equal to 0.53 times a comparison rate, said comparison rate being the rate per degree C. of supercooling when said garnet material is deposited from a comparison melt, said comparison melt consisting essentially of a PbO-$B_2O_3$ flux and garnet constituent oxides, the $B_2O_3$:PbO molecular ratio in said comparison melt being 1:15.6, and the molecular ratio of yttrium oxide or its substituents versus iron oxide or its substituents being such that said garnet material is deposited from said comparison melt.

2. Method of claim 1 in which PbO is comprised in said flux material in an amount in the range of 85–95 molecular percent.

3. Method of claim 1 in which said garnet material is magnetic.

4. Method of claim 1 in which heating is at a temperature which corresponds to supercooling of said garnet material by at least 3 degrees C.

5. Method of claim 1 in which said layer has a thickness which is less than or equal to 2 micrometers.

6. Article of manufacture comprising a magnetic bubble device made according to the method of claim 1.

* * * * *